United States Patent
Lavoie et al.

(10) Patent No.: US 8,012,878 B2
(45) Date of Patent: Sep. 6, 2011

(54) ATOMIC LAYER VOLATILIZATION PROCESS FOR METAL LAYERS

(75) Inventors: Adrien R. Lavoie, Beaverton, OR (US); Harsono S. Simka, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 1071 days.

(21) Appl. No.: 11/772,198

(22) Filed: Jun. 30, 2007

(65) Prior Publication Data

US 2009/0004860 A1   Jan. 1, 2009

(51) Int. Cl.
*H01L 21/302* (2006.01)
(52) U.S. Cl. ......... 438/692; 438/722; 438/734; 438/742
(58) Field of Classification Search ................... 438/692, 438/722, 734, 742
See application file for complete search history.

(56) References Cited

U.S. PATENT DOCUMENTS

| | | | |
|---|---|---|---|
| 2005/0208754 A1* | 9/2005 | Kostamo et al. | 438/622 |
| 2007/0014919 A1* | 1/2007 | Hamalainen et al. | 427/248.1 |
| 2007/0148350 A1* | 6/2007 | Rahtu et al. | 427/249.17 |
| 2007/0200243 A1* | 8/2007 | Kraus et al. | 257/763 |

* cited by examiner

*Primary Examiner* — Binh X Tran
(74) *Attorney, Agent, or Firm* — Rahul D. Engineer

(57) ABSTRACT

A two-stage method to remove a metal layer from a substrate surface comprises using a CMP process to remove a first portion of the metal layer from the substrate surface, and using an ALV process to remove a second portion of the copper layer from the substrate surface. The ALV process comprises pulsing a co-reactant into a reactor housing the substrate, wherein the co-reactant reacts with the metal layer to form a volatile metal-containing product, and then evacuating the reactor to volatize and remove the metal-containing product.

11 Claims, 4 Drawing Sheets

ATOMIC LAYER VOLATILIZATION PROCESS FOR METAL LAYERS

BACKGROUND

During the manufacture of integrated circuits on semiconductor wafers, chemical mechanical polishing (CMP) processes are often used to planarize layers of deposited material. For instance, when trenches and vias are etched into a dielectric layer and filled with copper metal during a dual damascene process, a CMP process may follow to polish away any excess copper that has deposited onto the surface of the dielectric layer.

Typical CMP processes suffer from various drawbacks. The CMP process can cause dishing and erosion of the metal layer. Some areas of the metal layer may become over-polished while other areas become under-polished, causing the surface topography of the metal layer to be highly uneven. This uneven topography may accumulate as additional metal layers are deposited may lead to variations of final metal dimensions and electrical performance across the integrated circuit.

Since the polishing is uneven over the surface of the wafer, conventional CMP methods require that the wafer be intentionally over-polished to ensure that all of the metal is removed from the surface of the dielectric layer. Unfortunately, over-polishing results in the loss of metal within the features and the loss of a portion of the dielectric layer, yielding trenches and vias with lower metal volume and decreased aspect ratios.

Other drawbacks include reduced selectivity between the metal and the dielectric material due to the mechanical component of the CMP process, difficulty in ascertaining when a predetermined thickness has been reached when polishing down a layer, contamination due to wetting issues, accidental overexposing layers of material, and the force of the CMP process causing scratches or damage to the surface of a semiconductor wafer. Accordingly, improved processes are needed for the removal of excess metal from the surface of a semiconductor wafer.

DETAILED DESCRIPTION

Described herein are systems and methods of removing metal from the surface of a wafer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide a process by which metal may be removed from the surface of a semiconductor wafer, such as the surface of an interlayer dielectric (ILD), with reduced over-polishing and under-polishing issues. The methods described herein combine a bulk CMP process with a novel atomic layer volatilization (ALV) process to efficiently planarize a metal layer and produce a more even surface topography with reduced ILD loss. As such, subsequently deposited layers do not exacerbate surface topography issues and the aspect ratio of features within the ILD layers is maintained.

Figure 1:
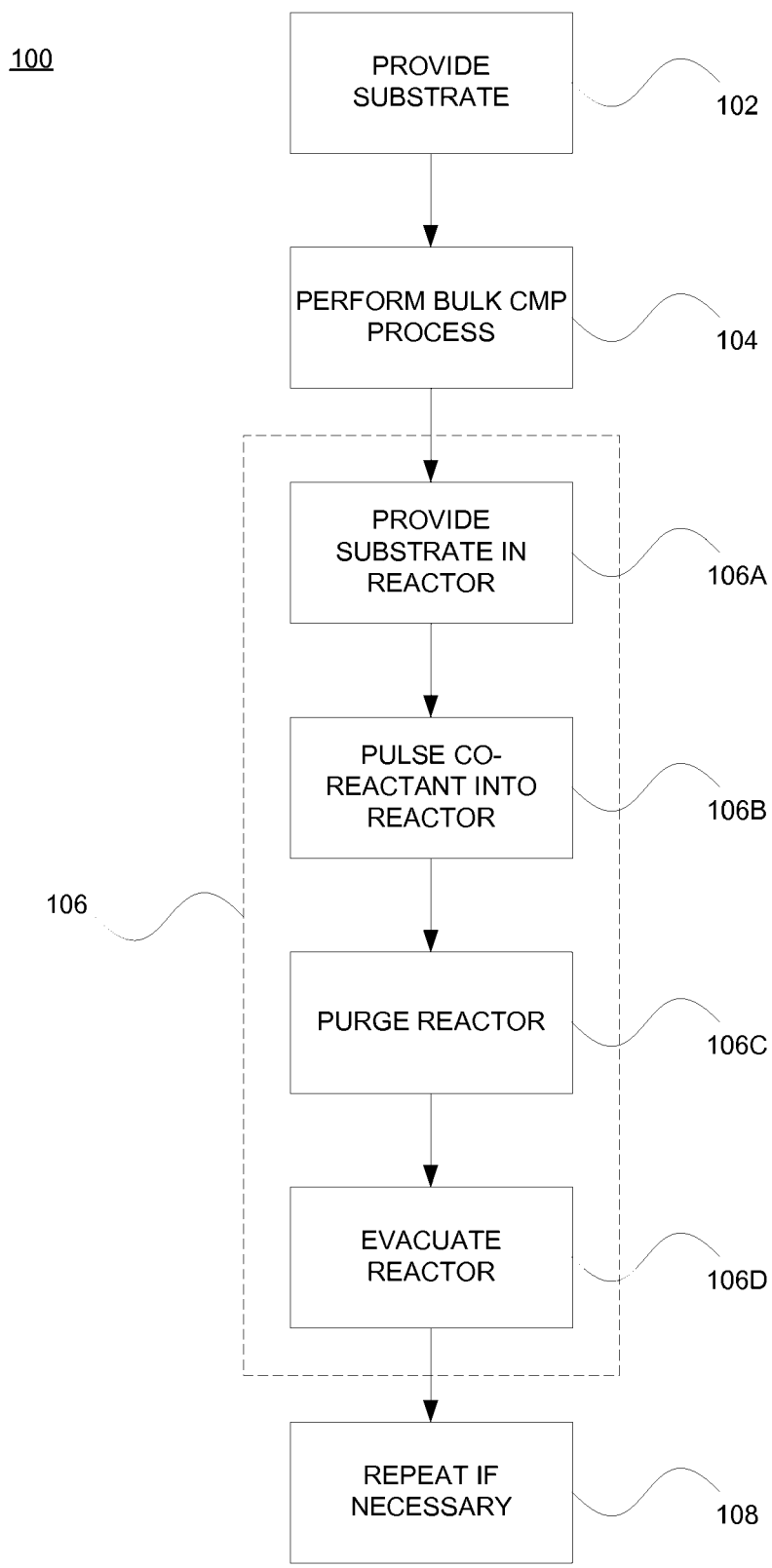
FIG. 1 is a two-stage process for removing metal from a substrate in accordance with an implementation of the invention.

FIG. 1 is a method 100 of removing a metal layer from a substrate in accordance with an implementation of the invention. For the implementations described herein, the metal layer consists of a copper metal layer. It is to be understood, however, that in further implementations, metals other than copper may be used. FIGS. 2A through 2F illustrate structures formed when the method 100 is carried out.

The method begins by providing a substrate with a dielectric layer and an overburdened copper metal layer needing to be removed (102 of FIG. 1). The dielectric layer includes at least one feature, such as a trench or a via, that is filled with the copper metal. The copper layer has generally been deposited using a process such as chemical vapor deposition (CVD), physical vapor deposition (PVD), atomic layer deposition (ALD), electroplating (EP), or electroless plating (EL). Alternate deposition processes may have been used.

Figure 2A:
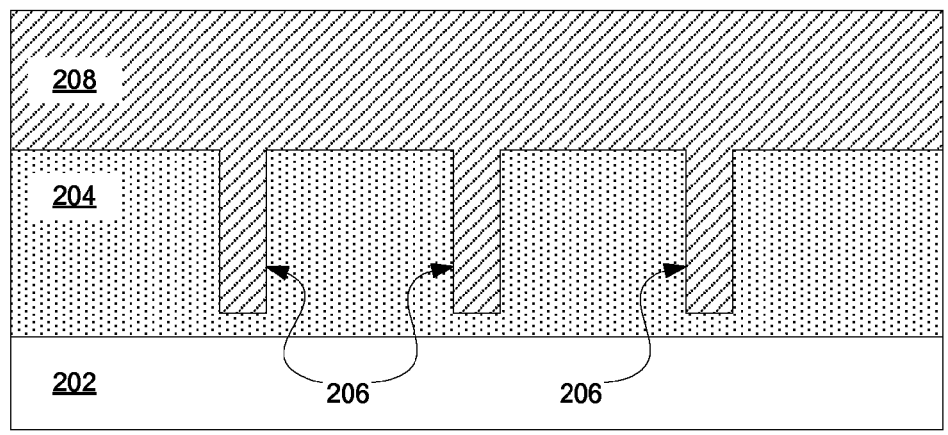
FIGS. 2A to 2F illustrate structures formed when the process of FIG. 1 is carried out.

FIG. 2A illustrates a substrate 202 with a dielectric layer 204 deposited thereon. The dielectric layer 204 includes a feature 206, such as a trench or a via. An overburdened copper layer 208 is deposited on the dielectric layer 204 and fills the feature 206. The overburdened copper layer 208 may have a thickness that is typical in the art. For instance, the thickness of the overburdened copper layer 208 may range from 100 Angstroms (Å) to 5000 Å or more. The substrate 202 is generally formed using a bulk silicon or a silicon-on-insulator substructure, although it may be formed using materials such as germanium, indium antimonide, lead telluride, indium arsenide, indium phosphide, gallium arsenide, or gallium antimonide, any of which may be combined with silicon. Materials that may be used to form the dielectric layer 204 include, but are not limited to, silicon dioxide ($SiO_2$), carbon-doped oxide (CDO), silicon nitride (SiN), organic polymers such as perfluorocyclobutane (PFCB), and fluorosilicate glass (FSG).

In accordance with implementations of the invention, a two-stage polishing process is carried out to remove the copper metal from the surface of the dielectric layer. The first stage is a bulk CMP process to remove a bulk portion of the overburdened copper layer (104 of FIG. 1). The CMP process ends with little or no damage to the underlying dielectric material, leaving a thin copper metal layer over the dielectric layer. The second stage is a novel ALV process that precisely removes the remaining copper metal from the dielectric layer with minimal damage to the dielectric material (106 of FIG. 1). Unlike conventional CMP processes, the ALV process does not apply a downward force on the surface of the dielectric layer, thereby reducing mechanical defects such as scratches.

The bulk CMP process (104) may be a conventional polishing process. As is well known in the art, a CMP process generally involves the use of a rotating polishing pad and an abrasive, corrosive slurry on a semiconductor wafer. After a material such as copper metal is deposited on the surface of a semiconductor wafer, the polishing pad and the slurry physically grind flat the microscopic topographic features until the metal is planarized. Chemical reactions that take place between the slurry and the wafer surface further contribute to the planarizing process. In implementations of the invention, the metal is polished by the polishing pad until the metal is reduced to a predetermined thickness ranging from 20 Å to 500 Å. At this point, a thin copper metal layer remains covering both the dielectric layer and the metal-filled feature. Since the dielectric layer has not been exposed, the thin copper metal layer protects the underlying dielectric layer from the drawbacks of CMP processes described above.

In accordance with implementations of the invention, conventional CMP slurries may be used. For instance, some conventional CMP slurries include abrasive particles such as silicon dioxide ($SiO_2$), aluminum oxide ($Al_2O_3$), or cerium oxide ($CeO_2$). The CMP slurries used may also include additional components, including but not limited to oxidizer species such as hydrogen peroxide ($H_2O_2$), organic complexing agents, surfactants with both hydrophobic and hydrophilic chemical groups, and/or corrosion inhibitors such as benzotriazole.

Figure 2B:
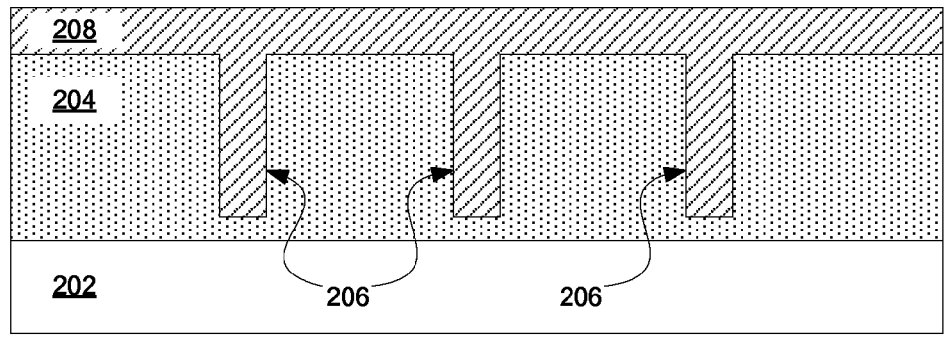

FIG. 2B illustrates the substrate 202 after the CMP process has been carried out to remove a portion of the copper metal layer 208. As shown, the CMP process yields a relatively thin copper metal layer 208 remaining on the dielectric layer 204. Although not shown in FIG. 2B, a surface topography of the thin copper metal layer 208 is generally uneven.

Once the endpoint of the CMP process is reached, the method 100 continues by using an ALV process to remove the thin copper metal layer that remains on the dielectric layer (106). The ALV process 106 may begin by providing the substrate in a reactor (process 106A). The reactor may be the same type of reactor used in the art for ALD and CVD processes. In some implementations, the substrate may be heated within the reactor to a temperature between around 25° C. and around 450° C. and the pressure within the reactor may range from 0.01 Torr to 30.0 Torr.

Next, a co-reactant is pulsed into the reactor (106B). In accordance with implementations of the invention, the co-reactant is a material that is capable of reacting with the metal layer to form a volatile metal-containing product. In some implementations of the invention, the co-reactant is an oxygen based co-reactant such as oxygen ($O_2$), ozone ($O_3$), or carbon monoxide (CO). In further implementations of the invention, the co-reactant is a halide based co-reactant such as hydrogen chloride (HCl), hydrogen bromide (HBr), hydrogen fluoride (HF), bromine ($Br_2$), chlorine ($Cl_2$), or fluorine ($F_2$). In further implementations of the invention, alternate oxygen-based or halide-based co-reactants may be used.

In various implementations of the invention, the following process parameters may be used for the co-reactant pulse. The co-reactant pulse may have a duration that ranges from around 0.05 seconds to around 90 seconds with a flow rate that ranges from around 25 standard cubic centimeters per minute (SCCM) to 500 SCCM, depending on hardware and process demands. The specific number of co-reactant pulses may range from 1 to 1000 pulses. The co-reactant temperature may be between around 25° C. and 300° C.

A carrier gas may be employed to transport the co-reactant, with a temperature that generally ranges from around 25° C. to around 300° C. Carrier gases that may be used here include, but are not limited to, argon (Ar), xenon (Xe), helium (He), hydrogen ($H_2$), nitrogen ($N_2$), forming gas, or mixture of these gases. The flow rate of the carrier will vary based on hardware designs and process demands.

An RF energy source may be applied at a power that ranges from 5 W to 2000 W and at a frequency of 13.56 MHz, 27 MHz, or 60 MHz. It should be noted that the scope of the invention includes any possible set of process parameters that may be used to carry out the implementations of the invention described herein.

In accordance with implementations of the invention, the co-reactant reacts with the thin copper metal layer to convert a top portion of the copper metal into a thin, volatile copper-containing product. The thickness of the copper metal layer is therefore reduced since the top portion of the copper metal is consumed when forming the volatile copper-containing product. Oxygen-based co-reactants such as $O_2$ and $O_3$ generally form a volatile copper oxide layer with the composition $CuO_n$, where n is typically 1 or 2. Halide-based co-reactants generally form a volatile copper halide layer with the composition $CuX_n$, where X is typically Cl, Br, or F and where n is typically 1 or 2.

Figure 2C:
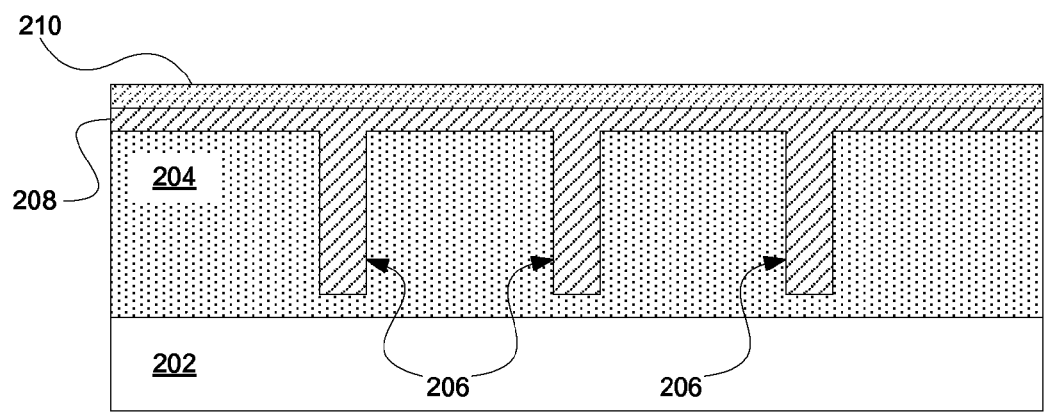

FIG. 2C illustrates the substrate 202 after the co-reactant has reacted with a top portion of the copper metal layer 208 to form a copper oxide or halide layer 210. As shown, the copper oxide or halide layer 210 consumes a portion of the copper metal layer 208, thereby reducing the thickness of the copper metal layer 208.

After the copper oxide or halide layer has been formed, the method 100 continues by purging the reactor (106C). The purge gas may be an inert gas such as Ar, Xe, $N_2$, He, or forming gas and the duration of the purge may range from 0.1 seconds to 60 seconds, depending on the ALV reactor configurations and other operating conditions. In most implementations of the invention, the purge may range from 0.05 seconds to 10 seconds. In some implementations, this purge process may be omitted.

Next, in accordance with implementations of the invention, the reactor is evacuated to volatize the copper oxide or copper halide (106D). The pressure within the reactor therefore is adjusted to a value between 0.001 Torr to 29 Torr. The volatized copper oxide or copper halide lifts off the surface of the copper metal layer and is removed from the reactor during the evacuation process. The copper metal layer is left having a reduced thickness due to the removal of copper by the volatized copper oxide or copper halide. In some implementations, the purge and evacuation processes are carried out simultaneously.

Figure 2D:
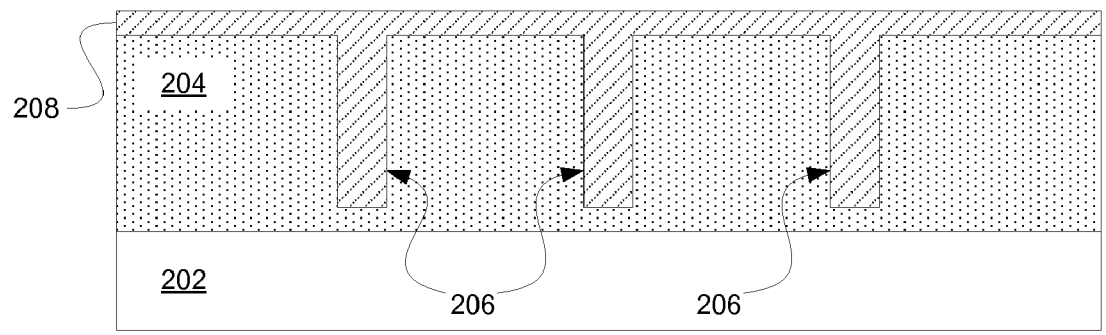

FIG. 2D illustrates the substrate 202 after the reactor has been evacuated and the copper oxide or copper halide layer 210 has volatized and been removed. As shown, the copper metal layer 208 remains with a reduced thickness due to the loss of copper metal by the ALV process.

The above described ALV process (106) may be repeated one or more times to remove the copper metal layer in its entirety (108 of FIG. 1). For example, in some implementations, the ALV process may be repeated 2 to 1000 times in order to remove all of the copper metal. The ALV process is a selective process that reacts with and volatizes the copper metal over the dielectric material. As such, the copper metal may be entirely removed from the surface of the dielectric layer without damage to or loss of the dielectric material. The ALV process of the invention therefore maintains metal in the trenches and vias and also maintains aspect ratios.

Figure 2E:
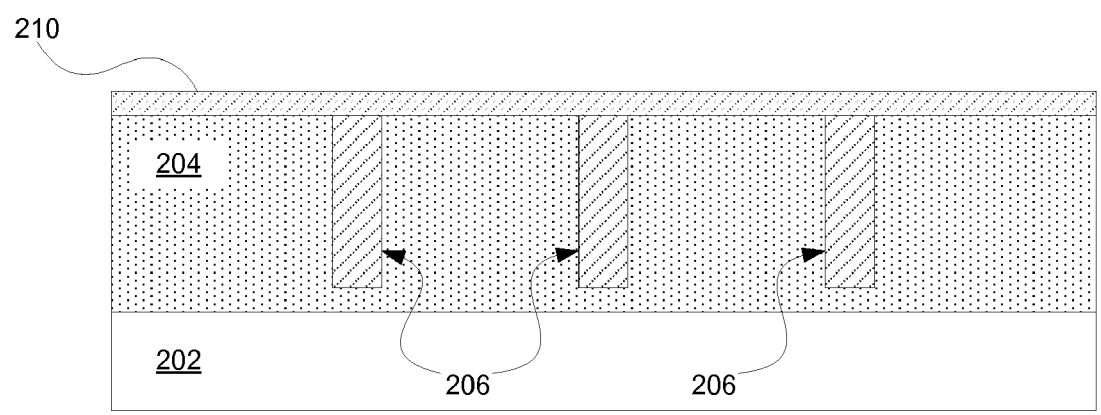
Figure 2F:
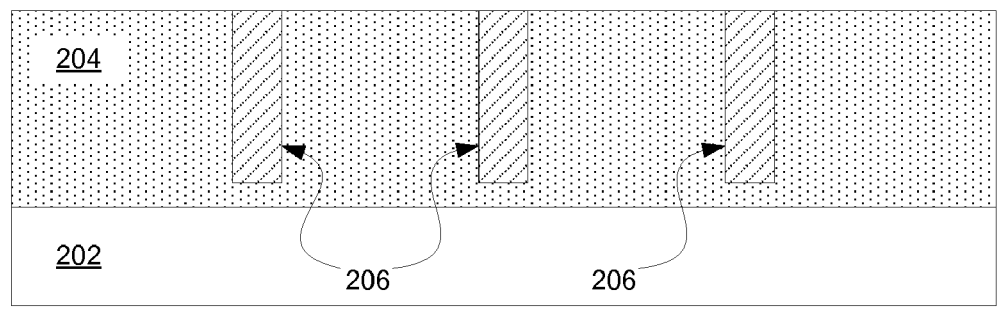

FIGS. 2E and 2F illustrate the substrate 202 undergoing a subsequent ALV process to remove the remaining portion of the copper metal layer. FIG. 2E illustrates the conversion of the remaining copper metal into a copper oxide or copper halide layer 210. FIG. 2F illustrates the substrate 202 after the copper oxide or copper halide 210 has been volatized and removed, leaving behind a dielectric layer 204 free of copper metal on its top surface. The feature 206 still includes its copper metal and substantially maintains its aspect ratio since little or no portion of the dielectric layer 204 was polished away.

In further implementations of the invention, the ALV process described herein may be used to remove other metal layers, such as barrier layers and adhesion layers. As is known in the art, after a feature is etched into the dielectric layer during a dual damascene process, a barrier layer is generally deposited over the dielectric layer and into the feature to prevent copper metal from diffusing into the dielectric material. The barrier layer is often formed of a metal such as tantalum, tantalum nitride, titanium, titanium nitride, tungsten, tungsten nitride, cobalt, cobalt nitride, nickel, nickel nitride, ruthenium, or ruthenium nitride. An adhesion layer is then deposited over the barrier layer to enable the subsequent deposition of copper. The adhesion layer is generally formed of a metal such as tantalum, titanium, or ruthenium. The portions of the barrier layer and adhesion layer outside of the features, namely on the surface of the dielectric layer, are typically removed using a conventional CMP process.

In accordance with implementations of the invention, however, an ALV process may be used to remove the excess barrier and adhesion metals. In an implementation of the invention, oxygen or halide based co-reactants are pulsed into the reaction chamber to react with the metals used to form the barrier and adhesion layers. For instance, the oxygen-based co-reactants may form tantalum oxide, titanium oxide, tungsten oxide, cobalt oxide, nickel oxide, or ruthenium oxide, while the halide-based co-reactants may form a tantalum halide, a titanium halide, a tungsten halide, cobalt halide, nickel halide, or a ruthenium halide. For tantalum, titanium, and ruthenium, oxygen-based co-reactants generally form a tantalum oxide, titanium oxide, or ruthenium oxide layer with the composition $TaO_n$, $TiO_n$, or $RuO_n$ where n typically ranges from 1 to 5. Alternately, an oxygen-based co-reactant such as CO may be used to react with the barrier layer and/or adhesion layer to form a volatile carbonyl compound containing ruthenium, tantalum, or titanium. Further, for tantalum, titanium, and ruthenium, halide-based co-reactants generally form a tantalum halide, titanium halide, or ruthenium halide layer with the composition $TaX_n$, $TiX_n$, or $RuX_n$ where X is typically Cl, Br, or F and where n typically ranges from 1 to 5. The purge and evacuation process described above may then be used to volatilize the tantalum, titanium, or ruthenium compounds and remove them from the surface of the dielectric layer.

Figure 3A:
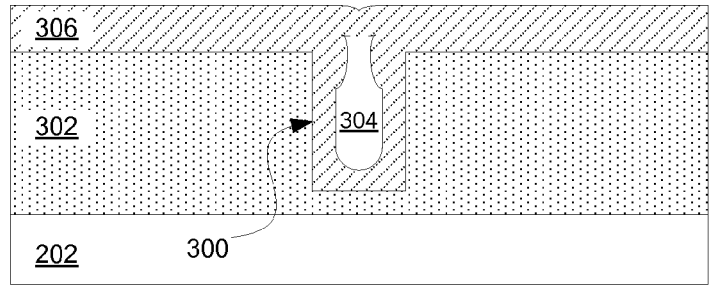
FIGS. 3A to 3C illustrate how an ALV process may be used to open up a pinched-off feature.

In an alternate implementation of the invention, the ALV process described herein may be used to open up features that have been pinched-off during a metal deposition process. FIG. 3A illustrates a feature 300 formed in a dielectric layer 302 that includes a void 304 that developed during the deposition of a copper metal layer 306. Due to the high-aspect ratio of the feature 300, issues such as trench overhang often lead to a pinching-off of the opening of the feature 300, which results in the formation of the void 304.

Figure 3B:
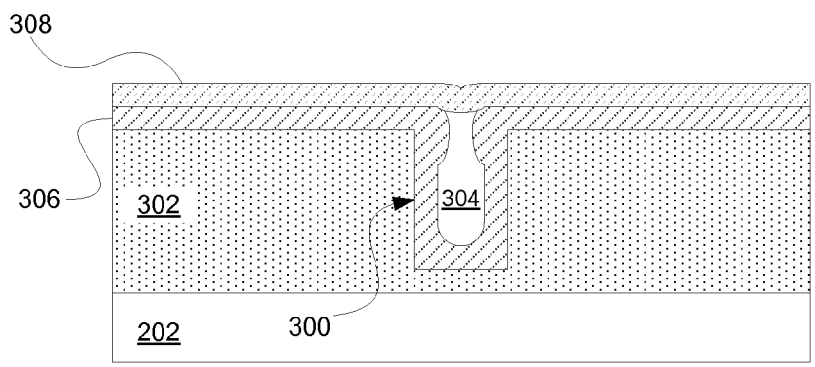
Figure 3C:
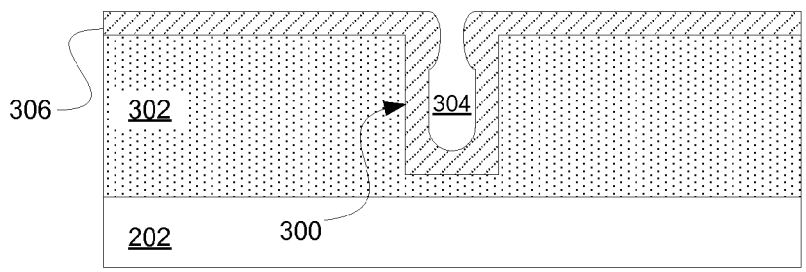

Turning to FIG. 3B, the ALV process described above may be used to convert a top portion of the copper metal layer 306 into a copper oxide or halide layer 308. The process conditions and co-reactants described above may be used here. Next, as shown in FIG. 3C, a purge and evacuation process may be used to volatilize and remove the copper oxide or halide layer 308, thereby reducing the thickness of the copper metal layer 306. In this instance, the ALV process removes enough copper metal to open up the feature 300, as shown in FIG. 3C. In further implementations, two or more ALV processes may be carried out to remove enough copper metal to open up the feature 300. A subsequent copper deposition process may follow, such as electroplating, electroless plating, CVD, or ALD, to fill the opened feature 300.

Accordingly, an atomic layer volatilization process has been described to precisely remove metal in a stepwise process that overcomes the issues inherent in conventional CMP processes. The ALV processes disclosed herein enable complete copper, barrier, and adhesion layer removal between features without resorting to a CMP overpolishing process that is required in conventional CMP processes to ensure complete metal removal. The use of an ALV process to remove metal from the surface of a substrate produces flatter surface topography, better wafer-scale uniformity, and reduced electrical RC variations compared to conventional CMP processes. Various interconnect metals, such as copper, tantalum, titanium, and ruthenium may be removed by the methods disclosed herein. Products such as CuCl, $CuCl_2$, $TiCl_4$, $TaCl_5$, and $RuCl_3$ are volatile and will be removed as gaseous by-products.

The ALV process of the invention provides many advantages over a conventional CMP process. For instance, the ALV process is a gas-phase process with no applied physical stresses (e.g. no downward pressure) that leads to good selectivity for copper removal and less scratching defects relative to CMP processes. The ALV processes of the invention also reduce erosion and dishing compared to conventional CMP processes.

Finally, the ALV processes described herein are compatible with existing semiconductor processing equipment. The co-reactants (both oxygen- and halide-based) have been used in furnace deposition and processing. For example, halide based ALD precursors (e.g., $TiCl_4$) are currently used in semiconductor processing.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A two-stage method to remove a metal layer from a substrate surface comprising:
   using a CMP process to remove a first portion of the metal layer from the substrate surface; and
   using an ALV process to remove a second portion of the metal layer from the substrate surface, wherein the ALV process comprises:
      pulsing a co-reactant into a reactor housing the substrate, wherein the co-reactant reacts with the metal layer to form a volatile metal-containing product, and
      evacuating the reactor to volatize and remove the metal-containing product.

2. The method of claim 1, wherein the second portion of the metal layer has a thickness less than around 100 Å.

3. The method of claim 1, further comprising purging the reactor before the reactor is evacuated.

4. The method of claim 1, wherein the ALV process is repeated as necessary to substantially remove the metal layer from the substrate surface.

5. The method of claim 1, wherein the co-reactant is an oxygen-based co-reactant.

6. The method of claim 5, wherein the oxygen-based co-reactant comprises $O_2$ or $O_3$.

7. The method of claim 1, wherein the co-reactant is a halide-based co-reactant.

8. The method of claim 7, wherein the halide-based co-reactant comprises HCl, HBr, HF, $Br_2$, $Cl_2$, or $F_2$.

9. The method of claim 1, wherein the metal is copper.

10. The method of claim 9, wherein the co-reactant comprises a material that can react with copper to form a volatile copper oxide with the composition $CuO_n$, wherein n is 1 or 2.

11. The method of claim 9, wherein the co-reactant comprises a material that can react with copper metal to form a copper halide layer with the composition $CuX_n$, wherein X is Cl, Br, or F and wherein n is 1 or 2.

\* \* \* \* \*